United States Patent
Lee et al.

(10) Patent No.: US 12,461,439 B2
(45) Date of Patent: *Nov. 4, 2025

(54) BLANK MASK AND PHOTOMASK USING THE SAME

(71) Applicant: SK enpulse Co., Ltd., Pyeongtaek-si (KR)

(72) Inventors: GeonGon Lee, Seoul (KR); Hahyeon Cho, Seoul (KR); Inkyun Shin, Seoul (KR); Seong Yoon Kim, Seoul (KR); Suk Young Choi, Seoul (KR); Hyung-joo Lee, Seoul (KR); Suhyeon Kim, Seoul (KR); Sung Hoon Son, Seoul (KR); Min Gyo Jeong, Seoul (KR); Taewan Kim, Seoul (KR)

(73) Assignee: SK enpulse Co., Ltd., Pyeongtaek-si (KR)

( * ) Notice: Subject to any disclaimer, the term of this patent is extended or adjusted under 35 U.S.C. 154(b) by 273 days.

This patent is subject to a terminal disclaimer.

(21) Appl. No.: 17/729,419

(22) Filed: Apr. 26, 2022

(65) Prior Publication Data
US 2022/0357647 A1 Nov. 10, 2022

(30) Foreign Application Priority Data
Apr. 29, 2021 (KR) .................... 10-2021-0055698

(51) Int. Cl.
*G03F 1/32* (2012.01)
(52) U.S. Cl.
CPC .................... *G03F 1/32* (2013.01)
(58) Field of Classification Search
None
See application file for complete search history.

(56) References Cited

U.S. PATENT DOCUMENTS

| 10,241,390 B2 | 3/2019 | Hanekawa |
| 2013/0065166 A1* | 3/2013 | Iwashita .................. G03F 1/26 430/5 |

(Continued)

FOREIGN PATENT DOCUMENTS

| CN | 101716581 A * | 6/2010 | .............. G03F 1/82 |
| CN | 102187275 A | 9/2011 | |

(Continued)

OTHER PUBLICATIONS

Keyence america website, "Ssk (Skewness) | Area Roughness Parameters" downloaded from https://www.keyence.com/ss/products/microscope/roughness/surface/ssk-skewness.jsp.*

(Continued)

*Primary Examiner* — Martin J Angebranndt
(74) *Attorney, Agent, or Firm* — NSIP Law

(57) ABSTRACT

The present disclosure relates to a blank mask including: a transparent substrate; and
a light shielding film disposed on the transparent substrate, wherein the light shielding film comprises a transition metal and at least one selected from the group consisting of oxygen and nitrogen, and wherein a Mtr value of Equation 1 below of a surface of the light shielding film is 6 or less:

Mtr=|Rsk|*Rku    [Equation 1]

where, in the Equation 1, |Rsk| is an absolute value of an Rsk value, which is a height skewness of the surface of the light shielding film, and Rku is kurtosis of the surface of the light shielding film.

18 Claims, 2 Drawing Sheets

100

(56) References Cited

U.S. PATENT DOCUMENTS

| | | | |
|---|---|---|---|
| 2013/0273738 A1* | 10/2013 | Sakai | G03F 1/50 |
| | | | 438/689 |
| 2015/0072273 A1 | 3/2015 | Suzuki et al. | |
| 2015/0301442 A1* | 10/2015 | Kageyama | G03F 1/38 |
| | | | 204/192.15 |
| 2017/0010526 A1 | 1/2017 | Suzuki et al. | |
| 2017/0139316 A1* | 5/2017 | Shishido | G03F 1/32 |
| 2017/0242330 A1 | 8/2017 | Hanekawa | |
| 2019/0064649 A1 | 2/2019 | Kominato et al. | |
| 2021/0255538 A1 | 8/2021 | Maeda et al. | |
| 2022/0350237 A1* | 11/2022 | Jeong | G03F 1/50 |
| 2022/0397819 A1* | 12/2022 | Lee | G03F 1/54 |
| 2023/0030141 A1* | 2/2023 | Lee | G03F 1/26 |
| 2023/0083755 A1* | 3/2023 | Lee | G03F 1/32 |
| | | | 430/5 |
| 2023/0110529 A1* | 4/2023 | Lee | G03F 1/46 |
| | | | 430/5 |
| 2023/0135037 A1* | 5/2023 | Jeong | G03F 1/32 |
| | | | 430/5 |
| 2023/0185185 A1* | 6/2023 | Lee | G03F 1/54 |

FOREIGN PATENT DOCUMENTS

| | | | | |
|---|---|---|---|---|
| CN | 106200259 A | * | 12/2016 | G03F 1/82 |
| JP | 08286359 A | * | 11/1996 | |
| JP | 2005-208282 A | | 8/2005 | |
| JP | 2006-103030 A | | 4/2006 | |
| JP | 2006-323236 A | | 11/2006 | |
| JP | 5483122 B2 | | 5/2014 | |
| JP | 5704773 B2 | | 4/2015 | |
| JP | 2016-66019 A | | 4/2016 | |
| JP | 2017-151427 A | | 8/2017 | |
| JP | 2018140924 A | * | 9/2018 | C03B 19/1461 |
| JP | 2018146760 A | * | 9/2018 | |
| JP | 2019-174628 A | | 10/2019 | |
| JP | 2020-74053 A | | 5/2020 | |
| JP | 6766676 B2 | | 10/2020 | |
| KR | 2007114025 A | * | 11/2007 | G03F 1/22 |
| KR | 10-2008-0071988 A | | 8/2008 | |
| KR | 2008106307 A | * | 12/2008 | G03F 1/54 |
| KR | 10-2010-0035559 A | | 4/2010 | |
| KR | 10-1207724 B1 | | 12/2012 | |
| KR | 2013051879 A | * | 5/2013 | |
| KR | 10-2014-0070660 A | | 6/2014 | |
| KR | 10-1593390 B1 | | 2/2016 | |
| KR | 10-2016-0031423 A | | 3/2016 | |
| KR | 2016031423 A | * | 3/2016 | G03F 1/20 |
| KR | 10-2019-0008110 A | | 1/2019 | |
| TW | 201617174 A | | 5/2016 | |
| TW | 202036153 A | | 10/2020 | |
| WO | WO-2006123630 A1 | * | 11/2006 | C23C 14/0641 |
| WO | WO 2016/047345 A1 | | 3/2016 | |
| WO | WO 2019/163310 A1 | | 8/2019 | |

OTHER PUBLICATIONS

Keyence america website, "Sku (Kurtosis) | Area Roughness Parameters" downloaded from ( https://www.keyence.com/ss/products/microscope/roughness/surface/sku-kurtosis.jsp.*

Singapore Office Action issued on Mar. 21, 2024, in counterpart Singapore Patent Application No. 10202204528P (13 pages).

Chinese Office Action issued on Sep. 3, 2025, in corresponding Chinese Patent Application No. 202210449936.7 (8 pages in English, 8 pages in Chinese).

Chinese Office Action issued on Apr. 30, 2025, in counterpart Chines Patent Application No. 202210449936.7(6 pages in English, 6 pages in Chinese).

* cited by examiner

<u>100</u>

<u>100</u>

<u>100</u>

100

200

BLANK MASK AND PHOTOMASK USING THE SAME

CROSS-REFERENCE TO RELATED APPLICATIONS

This application claims the benefit under 35 U.S.C. 119(a) of Korean Patent Application No. 10-2021-0055698 filed on Apr. 29, 2021 in the Korean Intellectual Property Office, the entire disclosure of which is incorporated herein by reference for all purposes.

BACKGROUND

1. Field

The present disclosure relates to a blank mask and a photomask using the same.

2. Description of Related Art

Due to high integration of semiconductor devices or the like, miniaturization of circuit patterns for semiconductor devices is being required. For this reason, an importance of a lithography technique, which is a technique for developing a circuit pattern on a wafer surface using a photomask, is being further emphasized.

To develop a miniaturized circuit pattern, a light source of exposure used in an exposure process (photolithography) is required to have a shorter wavelength. Recently, ArF excimer laser (wavelength of 193 nm) or the like is used as the light source of exposure.

There are a binary mask and a phase inversion mask as photomasks.

The Binary mask has a structure, in which a light shielding pattern layer is formed on a transparent substrate. A transmissive portion of the Binary mask not including a light shielding layer allows exposure light to be transmitted on a surface, where a pattern is formed, whereas a light shielding portion of the Binary mask including a light shielding layer shields exposure light, to transfer a pattern on photoresist film of a surface of a wafer. However, the Binary mask may cause a problem in developing a minute pattern due to diffraction of light occurring at the edge of the transmissive portion as the pattern becomes more miniaturized.

There are Levenson type, Outrigger type, and Half-tone type as a phase shift mask. Among the above, Half-tone type phase shift mask has a structure, in which a pattern is formed with semi-transmissive films on a transparent substrate. On a surface, where a pattern is formed from the Half-tone type phase shift mask, a transmissive portion not including a semi-transmissive layer allows exposure light to be transmitted, and a semi-transmissive portion including a semi-transmissive layer allows attenuated exposure light to be transmitted. The attenuated exposure light is allowed to have a phase difference compared to exposure light, which has entered the transmissive portion. Accordingly, diffraction light occurring at the edge of the transmissive portion is counteracted by the exposure light, which has transmitted the semi-transmissive portion, and thereby the phase shift mask can form a further refined minute pattern on the surface of the wafer.

SUMMARY

A blank mask according to one embodiment of the present disclosure includes a transparent substrate and a light shielding film disposed on the transparent substrate.

The light shielding film includes a transition metal and at least one selected from the group consisting of oxygen and nitrogen.

A Mtr value of Equation 1 below of a surface of the light shielding film is 6 or less:

$$Mtr=|Rsk|*Rku \qquad \text{[Equation 1]}$$

where, in the Equation 1, |Rsk| is an absolute value of an Rsk value, which is a height skewness of the surface of the light shielding film, and Rku is kurtosis of the surface of the light shielding film.

The Rsk value may be 1 or less.
The Rku value may be 6 or less.
A Dw value of Equation 2 below of the light shielding film may be 0.01% or less:

$$Dw = \frac{Ds - Do}{Do} \times 100(\%) \qquad \text{[Equation 2]}$$

where, in the Equation 2, Ds is a weight of the blank mask measured after forming a photoresist film of 1300 Å thickness on the light shielding film and removing the photoresist film, and Do is a weight of the blank mask measured before forming the photoresist film on the light shielding film.

The light shielding film may include a first light shielding layer and a second light shielding layer disposed on the first light shielding layer.

A sum of an amount of the nitrogen and the oxygen in the second light shielding layer may be 10 to 35 at %.

The transition metal may include at least any one selected from the group consisting of Cr, Ta, Ti and Hf.

The light shielding film may be treated by cooling with cooling water directly sprayed onto the surface of the light shielding film.

A photomask according to another embodiment of the present disclosure includes a transparent substrate and a light shielding pattern film disposed on the transparent substrate.

The light shielding pattern film includes a transition metal and at least one selected from the group consisting of oxygen and nitrogen.

A Mtr value of Equation 1 below of an upper surface of the light shielding pattern film is 6 or less.

$$Mtr=|Rsk|*Rku \qquad \text{[Equation 1]}$$

where, in the Equation 1, |Rsk| is an absolute value of an Rsk value, which is a height skewness of the surface of the light shielding film, and Rku is kurtosis of the surface of the light shielding film.

The Rsk value may be 1 or less.
The Rku value may be 6 or less.
The transition metal may include at least one selected from the group consisting of Cr, Ta, Ti and Hf.

A method of manufacturing a blank mask according to another embodiment includes: installing a transparent substrate and a sputtering target in a sputtering chamber; injecting an atmosphere gas into the sputtering chamber, supplying an electric power to the sputtering target, and thereby forming a pre-heating-treated substrate, in which a light shielding film has been formed on the transparent substrate; performing thermal treatment for 5 to 30 minutes at 150 to 330° C. to the pre-heating-treated substrate and thereby forming a pre-cooling-treated substrate; and spraying a cooling water directly onto a surface of the transparent substrate and a surface of the light shielding film of the pre-cooling-treated substrate and thereby manufacturing the blank mask.

The method may include stabilizing the pre-cooling-treated substrate for 1 to 5 minutes at 30 to 50° C.

The temperature of the cooling water may be 10 to 30° C.

The cooling water may be sprayed in a flow rate of 0.5 to 1.5 L/min at an angle of 30 to 75° onto the surface of the light shielding film.

A nozzle to spray the cooling water may be installed over the surface of the light shielding film and spaced apart by 5 to 20 mm from the surface of the light shielding film.

Two or more nozzles to spray the cooling water may be installed over one surface of the blank mask and an angle between the two or more nozzles when observed from the one surface is 60 degrees or more.

The thermal treatment may include a primary thermal treatment and a secondary thermal treatment.

The blank mask includes the transparent substrate and the light shielding film disposed on the transparent substrate.

The light shielding film includes a transition metal and at least one selected from the group consisting of oxygen and nitrogen.

A Mtr value of Equation 1 below of a surface of the light shielding film is 6 or less.

$$Mtr = |Rsk| * Rku \quad \text{[Equation 1]}$$

In the Equation 1, the |Rsk| is an absolute value of an Rsk value.

Other features and aspects will be apparent from the following detailed description and the claims

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
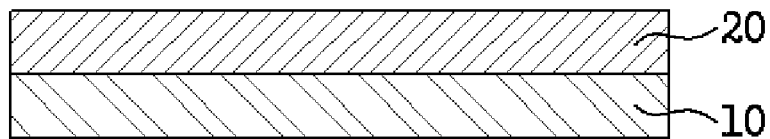
FIGS. 1 to 4 are conceptual views for illustrating a blank mask according to embodiments of the present disclosure.
Figure 2:
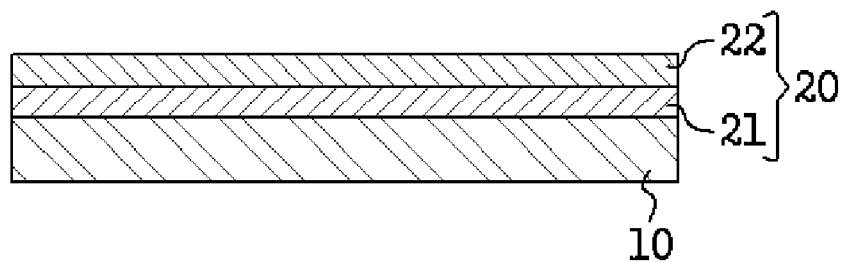
Figure 3:
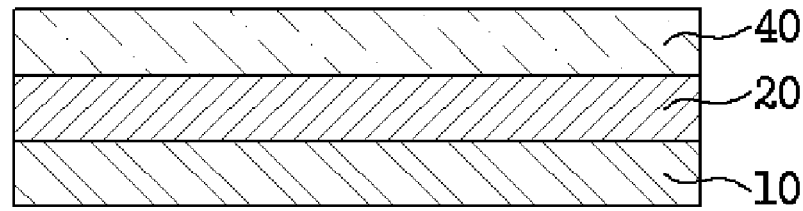
Figure 4:
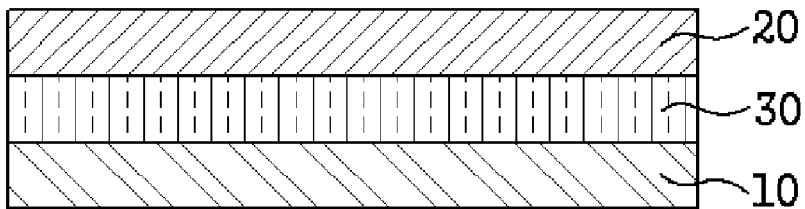

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

In this disclosure, the term for degree like "about", "substantially" and the like is used for meaning values approximative from/to the value when a tolerance to be proper to referred meaning for manufacture and substance is presented. Additionally, these terms for degree are used to help understanding of example embodiments and to prevent that an unconscionable trespasser unjustly uses the presented content in which exact or absolute number is referred.

Throughout this disclosure, the phrase "combination(s) thereof" included in a Markush-type expression denotes one or more mixtures or combinations selected from the group consisting of components stated in the Markush-type expression, that is, denotes one or more components selected from the group consisting of the components are included.

Throughout this disclosure, the description of "A and/or B" means "A, B, or A and B."

Throughout this disclosure, terms such as "first", "second", "A", or "B" are used to distinguish the same terms from each other unless specially stated otherwise.

In this disclosure, "B being placed on A" means that B is placed in direct contact with A or placed over A with another layer or structure interposed therebetween and thus should not be interpreted as being limited to B being placed in direct contact with A.

In this disclosure, a singular form is contextually interpreted as including a plural form as well as a singular form unless specially stated otherwise.

In this disclosure, room temperature refers to 20 to 25° C.

Rsk is a value evaluated in accordance with ISO_4287. The Rsk value shows the height skewness of the surface profile of the measuring target.

Rku is a value evaluated in accordance with ISO_4287. The Rku value show the kurtosis of the surface profile of the measuring target.

Peak is a profile portion disposed on an upper portion of a reference line (refers to the height average line from the surface profile) from the surface profile of the light shielding film.

Valley is a profile portion disposed on a lower portion of a reference line from the surface profile of the light shielding film.

The present disclosure illustrates a photoresist film as an example of thin films disposed in contact with the light shielding film. However, all the thin films that are disposed in contact with the light shielding film and, to which a removing process of subsequent processes may be applied, may have a characteristic of embodiments. The thin film disposed in contact with the light shielding film is not limited to a photoresist film.

Due to high integration of a semiconductor, further miniaturized circuit pattern is required to be disposed on a semiconductor wafer. As a critical dimension (CD) of a pattern developed on the semiconductor wafer is further decreased, issues related to a resolution of a photomask for developing the pattern is on increasing trend.

The characteristics related to forming or removing a photoresist film on a light shielding film may be influencing factors in degradation of resolution of a photomask. In detail, edge portion of the developed photoresist pattern film may fall off depending on adhesive strength between the applied photoresist film and the light shielding film. Also, in the process of removing the photoresist pattern after the light shielding film is patterned using a photoresist pattern as a mask, a problem of some residual photoresist pattern remaining on the surface of the light shielding film pattern may come up. Such a problem leads to generating particles in a semiconductor wafer exposure process.

The inventors of the present disclosure verified that the adhesion between a light shielding film and a photoresist film may be improved and convenience of removing a photoresist pattern may also be improved by controlling the surface roughness characteristics and the like of the light shielding film, and completed example embodiments.

Hereinafter, example embodiments will be described in further detail.

FIGS. 1 to 4 are conceptual views for illustrating the blank masks according to embodiments of the present specification. With reference to the FIGS. 1 to 4, the example embodiments are described.

In a general aspect, the blank mask 100 according to one embodiment includes a transparent substrate 10 and a light shielding film 20 disposed on the transparent substrate 10.

A material of the transparent substrate 10 is not limited when the material has light transmission property for an exposure light and can be applied to a photomask 200. Specifically, the transmittance for an exposure light with a wavelength of 193 nm of the transparent substrate 10 may be 85% or more. The transmittance may be 87% or more. The transmittance may be 99.99% or less. For example, the transparent substrate 10 may be a synthetic quartz substrate. In such a case, attenuation of a light transmitting the transparent substrate 10 may be suppressed.

Additionally, by controlling the surface characteristics such as flatness and roughness of the transparent substrate 10, the occurrence of optical distortion can be suppressed.

The light shielding film 20 may be disposed on an upper side of the transparent substrate 10.

The light shielding film 20 may have a characteristic of blocking at least some portion an exposure light incident from a back side of the transparent substrate 10. Also, when a phase shift film 30 or the like is disposed between the transparent substrate 10 and the light shielding film 20, the light shielding film 20 may be used as an etching mask in a process of etching the phase shift film 30 to be patterned.

Surface Roughness Characteristic of Light Shielding Film

A Mtr value of Equation 1 below of a surface of the light shielding film 20 is 6 or less.

$$Mtr = |Rsk| * Rku \quad \text{[Equation 1]}$$

In the Equation 1, the |Rsk| is an absolute value of an Rsk value.

The light shielding film 20 may be formed through a sputtering process and the like. The sputtering process forms a film by depositing sputtering particles sporadically on a surface of a film formation target. When the light shielding film 20 is formed by a sputtering process, sputtering particles may be sporadically deposited on the surface of the film formation target. Due to this, the light shielding film 20 may have a surface, in which minute peaks and valleys are distributed.

For patterning the light shielding film 20, a photoresist film 40 may be disposed on the light shielding film 20. Through an electronic beam exposure device or the like, a photoresist pattern (not shown) may be formed from the photoresist film 40. The photoresist pattern may be removed after patterning of the light shielding film.

As factors affecting characteristics related to forming and removing the photoresist film 40 on the light shielding film 20, there are surface roughness characteristics of the light shielding film 20, the difference in the surface energy between a light shielding film 20 and a photoresist film 40, the properties of a compound. which is treated to the surface of the light shielding film 20 before the photoresist film 40 is formed. Particularly, the example embodiment can increase adhesion between the photoresist film 40 and the light shielding film 20, and can improve removal convenience of the light shielding film 20 by controlling the surface roughness characteristics of the light shielding film 20. Also, the degradation of the resolution of the photomask 200 can be substantially suppressed.

In detail, before a process of forming a photoresist film, a process of treating the surface of the light shielding film 20 with an adhesion enhancing compound such as HMDS (Hexamethyldisilazane) and another organic silane-based compound can be applied to increase adhesion between the light shielding film 20 and the photoresist film 40. In the process of treating the surface of the light shielding film 20, the adhesion enhancing compound may not be sufficiently coated in some area depending on roughness in the in-plane direction of the surface of the light shielding film 20. Particularly, the compound may not be coated enough in the area, where multiple peaks are concentrated. Also, the two thin films may not have a sufficient adhesive strength due to the difference in the surface energy between the light shielding film 20 and the photoresist film 40.

In the process of removing the photoresist pattern after patterning the light shielding film 20, some of the photoresist pattern may not be removed. Particularly, the photoresist pattern may partially remain in an area, where valleys are concentrated on a surface of the patterned light shielding film. A residue of the photoresist pattern may form particles, and may be one of reasons degrading the resolution of the photomask 200.

To solve these problems, a method of simply reducing a height of peaks formed on the surface of the light shielding film 20 using an etchant may be considered. However, the critical dimension (CD) is on a trend of demanding miniaturization, and thereby the peaks having decreased heights still can cause a problem related to forming and removing of the photoresist film 40. That is, a surface characteristics of the light shielding film is required to be controlled more accurately.

Accordingly, the inventors confirmed that the photoresist film 40 have stable adhesion with the light shielding film 20 even though minute peaks and valleys are present on the surface of the light shielding film 20, and the formation of residual photoresist could be effectively suppressed when the photoresist pattern is removed, through controlling the Mtr value, which could reflect both of skewness and kurtosis characteristics of the surface of the light shielding film 20.

The Rsk value, Rku value, and Mtr value of the surface of the light shielding film 20 can be controlled by factors such as the conditions of a sputtering process when the light shielding film 20 is formed through sputtering, the atmosphere gas when the light shielding film 20 is treated with heat, the conditions of thermal treatment such as the rate of temperature change, the conditions of a cooling process, and the like. The detailed description for means to control Mtr value is overlapped with the description below and omitted.

The method of measuring Rsk value, Rku value and Mtr value of the surface of the light shielding film 20 is the same as follows.

The Rsk value, Rku value and Mtr value of the surface of the light shielding film 20 are measured in the center area of the surface of the light shielding film 20. The center area of the surface of the light shielding film 20 refers to the area of 1 μm width and length placed in the center portion of the surface of the light shielding film 20.

The Rsk value and Rku value in the center area are measured by using a two-dimensional roughness meter. The scan speed is set to be 0.5 Hz in Non-contact mode during measurement. For example, the Rsk value and Rku value can be measured by applying XE-150 model available from PARK SYSTEM including PPP-SCHR as a probe, which is Cantilever model also available from PARK SYSTEM.

The Mtr value of the surface of the light shielding film 20 is calculated from the measured Rsk value and Rku value.

The Mtr value of the surface of the light shielding film 20 may be 6 or less. The Mtr value may be 4 or less. The Mtr value may be 1.5 or less. The Mtr value may be more than 0. The Mtr value may be 0.5 or more. In such a case, the adhesion of the photoresist film 40 for the light shielding film 20 is improved, and the formation of particles due to residual photoresist can be suppressed.

The Rsk value of the surface of the light shielding film 20 may be 1 or less.

When the Rsk value of the surface of the light shielding film 20 is controlled within the predetermined range, the formation of an area, where peaks are concentrated, can be suppressed. In the area, where peaks are concentrated, stable coating of an adhesion enhancing compound is difficult. Through this, an adhesive strength between a photoresist film 40 and a light shielding film 20 may be improved. Additionally, the valleys can be formed suitably on the surface of the light shielding film, and the formation of photoresist residue can be effectively suppressed.

The Rsk value of the surface of the light shielding film 20 may be 1 or less. The Rsk value may be 0.1 or less. The Rsk value may be −1 or more. The Rsk value may be −0.5 or more. In such a case, a photoresist film 40 or a photoresist pattern can be easily formed and removed.

The Rku value of the surface of the light shielding film 20 may be 6 or less.

The adhesion between the light shielding film 20 and the photoresist film 40 can be improved by controlling the Rku value of the surface of the light shielding film 20. In detail, the adhesion enhancing compound can be coated with a sufficient thickness and maintained on the front surface of the light shielding film 20, in which minute peaks and valleys have been formed, by controlling the kurtosis of the surface of the light shielding film 20.

The Rku value of the surface of the light shielding film 20 may be 6 or less. The Rku value may be 4 or less. The Rku value may be 3 or less. The Rku value may be 1 or more. The Rku value may be 2 or more. In such a case, the photoresist pattern can stably maintain a designed shape of the pattern.

The Rsk value and Rku value can be simultaneously adjusted by controlling Mtr value of the surface of the light shielding film 20. When only Rsk value of the surface of the light shielding film 20 is controlled, an adhesion enhancing compound may not be sufficiently coated and maintained on the surface of the light shielding film 20, and thereby the photoresist pattern may not be formed stably on the surface of the light shielding film 20. Also, when only Rku value is controlled within the predetermined range in example embodiments, peaks are excessively concentrated on the surface of the light shielding film 20 and thereby the adhesion enhancing compound coating layer may not be stably formed, or valleys are excessively concentrated and thereby removal of a photoresist pattern may not be easy. Accordingly, not only adhesion between the light shielding film 20 and the photoresist film 40, but also convenience in removing a photoresist pattern can be improved by simultaneously adjusting Rsk value and Rku value of the surface of the light shielding film 20.

Convenience in Removing Photoresist Film of Light Shielding Film

A Dw value of the light shielding film 20 of Equation 2 below may be 0.01% or less.

$$Dw = \frac{Ds - Do}{Do} \times 100(\%) \quad \text{[Equation 2]}$$

In the Equation 2, the Ds is a weight of the blank mask 100 measured after forming the photoresist film 40 of 1300 Å thickness on the light shielding film and removing the photoresist film.

The Do is a weight of the blank mask 100 measured before forming the photoresist film on the light shielding film 20.

By controlling the Dw value within the predetermined range, the formation of particles due to photoresist residue can be suppressed.

The method of measuring Dw value of the light shielding film 20 is as follows.

The Do value, which is the weight of the blank mask, is measured before forming the photoresist film.

In measuring Ds value, a photoresist composition is coated on the light shielding film 20 by coating the composition in a Spin Coating method. After that, the coated photoresist composition is dried for 620 seconds at 140° C. to form the photoresist film 40. The coated and dried photoresist film 40 is dipped in a peroxymonosulfuric acid ($H_2SO_5$) manufactured by mixing sulfuric acid ($H_2SO_4$) and hydrogen peroxide ($H_2O_2$), and removed therefrom for measurement of Ds value.

The Dw value is calculated from the measured Do value and Ds value.

The photoresist may be, for example, XFP255 model or XFP355 model available from FUJI.

The Dw value of the light shielding film 20 may be 0.01% or less. The Dw value may be 0.006% or less. The Dw value may be 0.001% or more. The Dw value may be 0.002% or more. In such a case, the degradation of the resolution of the photomask 200 due to photoresist residue can be suppressed.

The Composition and Thickness of Light Shielding Film

The light shielding film 20 may include a transition metal, and at least one selected from the group consisting of oxygen and nitrogen.

The light shielding film 20 may include a first light shielding layer 21 and a second light shielding layer 22 disposed on the first light shielding layer 21.

The example embodiments control an amount by elements included in the second light shielding layer 22, and thereby can help the light shielding film 20 to show desired extinction characteristics. Also, a side surface of the light shielding film 20 pattern is allowed to have a shape close to be vertical from a surface of a transparent substrate by the example embodiments. Besides, the example embodiments can help the photoresist pattern to be stably attached on the surface of the light shielding film 20 and maintained in a designed shape.

The second light shielding layer 22 may include a transition metal and at least one selected from the group consisting of oxygen and nitrogen. The second light shielding layer 22 may include the transition metal in an amount of 50 to 80 at %. The second light shielding layer 22 may include the transition metal in an amount of 55 to 75 at %. The second light shielding layer 22 may include the transition metal in an amount of 60 to 70 at %.

The sum of the amount of the oxygen and the amount of the nitrogen in the second light shielding layer 22 may be 10 to 35 at %. The sum of the amount of the oxygen and the amount of the nitrogen in the second light shielding layer 22 may be 15 to 25 at %.

The second light shielding layer may include nitrogen in an amount of 5 to 20 at %. The second light shielding layer 22 may include nitrogen in an amount of 7 to 13 at %.

In such a case, the second light shielding layer 22 can help the light shielding film 20 to have excellent extinction characteristics. Additionally, in the etching process of the light shielding film 20, line width of the patterned light shielding film can be more even in the thickness direction even though the upper portion of the light shielding film 20 is exposed to an etching gas for a long time. Besides, when a photoresist pattern is placed on an upper surface of the second light shielding layer 22, the photoresist pattern can be stably attached and maintained without deformation in the shape.

The first light shielding layer 21 may include a transition metal, oxygen, and nitrogen. The first light shielding layer 21 may include the transition metal in an amount of 30 to 60 at %. The first light shielding layer 22 may include the transition metal in an amount of 35 to 55 at %. The first light shielding layer 21 may include the transition metal in an amount of 40 to 50 at %.

A sum of the amount of the oxygen and the amount of the nitrogen in the first light shielding layer 21 may be 40 to 70 at %. The sum of the amount of the oxygen and the amount of the nitrogen in the first light shielding layer 21 may be 45 to 65 at %. The sum of the amount of the oxygen and the amount of the nitrogen in the first light shielding layer 21 may be 50 to 60 at %.

The first light shielding layer 21 may include oxygen in an amount of 20 to 40 at %. The first light shielding layer 21 may include oxygen in an amount of 23 to 33 at %. The first light shielding layer 21 may include oxygen in an amount of 25 to 30 at %.

The first light shielding layer 21 may include nitrogen in an amount of 5 to 20 at %. The first light shielding layer 21 may include nitrogen in an amount of 7 to 17 at %. The first light shielding layer 21 may include nitrogen in an amount of 10 to 15 at %.

In such a case, the first light shielding layer 21 may help the light shielding film 20 to have excellent extinction characteristics. Also, when the light shielding film 20 is patterned, the occurrence of step can be suppressed in a side surface of the light shielding pattern film.

The transition metal may include at least one selected from the group consisting of Cr, Ta, Ti and Hf. The transition metal may be Cr.

A film thickness of the first light shielding layer 21 may be 250 to 650 Å. The film thickness of the first light shielding layer 21 may be 350 to 600 Å. The film thickness of the first light shielding layer 21 may be 400 to 550 Å. In such a case, the first light shielding layer 21 may help the light shielding film 20 to block an exposure light efficiently.

A film thickness of the second light shielding layer 22 may be 30 to 200 Å. The film thickness of the second light shielding layer 22 may be 30 to 100 Å. The film thickness of the second light shielding layer 22 may be 40 to 80 Å. In such a case, the second light shielding layer 22 can help to improve extinction characteristics of the light shielding film 20, and can help the critical dimension of the light shielding pattern film to have more uniform value.

A ratio of the film thickness of the second light shielding layer 22 compared to the film thickness of the first light shielding layer 21 may be 0.05 to 0.3. The film thickness ratio may be 0.07 to 0.25. The film thickness ratio may be 0.1 to 0.2. In such a case, the light shielding film 20 may have excellent extinction characteristics. Additionally, when the light shielding film is patterned, the light shielding pattern film may form a side surface close to be vertical from the surface of the transparent substrate.

Optical Properties of Light Shielding Film

The light shielding film 20 may have an optical density of 1.8 or more for a light with a wavelength of 193 nm. The light shielding film 20 may have an optical density of 1.9 or more for a light with a wavelength of 193 nm.

The light shielding film 20 may have a transmittance of 1.5% or less for a light with a wavelength of 193 nm. The light shielding film 20 may have a transmittance of 1.4% or less for a light with a wavelength of 193 nm. The light shielding film 20 may have a transmittance of 1.2% or less for a light with a wavelength of 193 nm.

In such a case, a pattern comprising the light shielding film 20 can block transmission of an exposure light effectively.

A phase shift film 30 may be disposed between the transparent substrate 10 and the light shielding film 20. A thin film comprising the phase shift film 30 and the light shielding film 20 may have an optical density of 3 or more for a light with a wavelength of 193 nm. The thin film may have an optical density of 3.2 or more for a light with a wavelength of 193 nm. In such a case, the thin film can suppress transmission of an exposure light effectively.

Other Thin Films

As other films, a phase shift film 30, a hard mask film (not shown), and the like may be applied.

The phase shift film 30 may be disposed between the transparent substrate 10 and the light shielding film 20. The phase shift film 30 may attenuate an intensity of an exposure light transmitting the phase shift film, may adjust a phase of the exposure light, and thereby can substantially suppress a diffraction light occurring in the edge of a pattern.

The phase shift film 30 may have a phase difference of 170 to 190° for a light with a wavelength of 193 nm. The phase difference may be 175 to 185°. The phase shift film 30 may have a transmittance of 3 to 10% for a light with a wavelength of 193 nm. The transmittance may be 4 to 8%. In such a case, the resolution of the photomask 200 comprising the phase shift film 30 can be improved.

The phase shift film 30 may include a transition metal and silicon. The phase shift film 30 may include a transition metal, silicon, oxygen, and nitrogen. The transition metal may be molybdenum.

A hard mask (not shown) may be placed on the light shielding film 20. The hard mask may function as an etching mask film when a pattern of the light shielding film 20 is etched. The hard mask may include silicon, nitrogen, and oxygen.

Photomask

Figure 5:
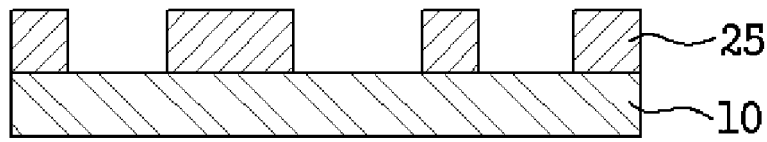
FIG. 5 is a conceptual view for illustrating a photomask blank according to another embodiment of the present disclosure.
Figure 6:
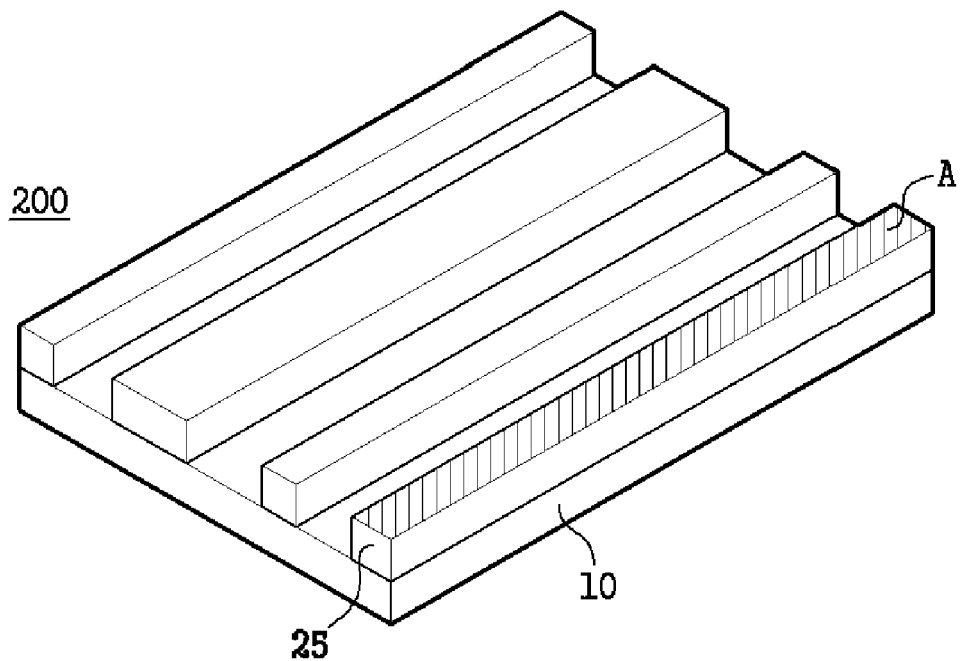
FIG. 6 is a conceptual view for illustrating a measuring area of Mtr value of a photomask.

FIG. 5 is a conceptual view for illustrating the photomask according to another embodiment of the present specification. FIG. 6 is a conceptual view for illustrating the measuring method of Mtr value of an upper surface of the light shielding pattern film in the photomask. With reference to the FIGS. 5 and 6, an example embodiment is described.

The photomask 200 according to another embodiment includes a transparent substrate 10 and a light shielding pattern film 25 disposed on the transparent substrate 10.

The light shielding pattern film 25 includes a transition metal and at least one selected from the group consisting of oxygen and nitrogen.

A Mtr value of Equation 1 below in an upper surface of the light shielding pattern film 25 is 6 or less.

$$Mtr=|Rsk|*Rku \qquad \text{[Equation 1]}$$

In the Equation 1, the |Rsk| is the absolute value of an Rsk value.

The measuring method of Mtr value in the upper surface of the light shielding pattern film 25 is the same as the method of measuring Mtr value on the surface of the light shielding film 20 in the blank mask 100. However, the Mtr value is measured by setting a measuring area (A) to be an arbitrary area within the upper surface of the light shielding pattern film 25 disposed in the photomask.

The light shielding pattern film 25 may be manufactured by patterning the light shielding film of the blank mask 100 described in the above.

The description of the surface roughness characteristics, the convenience of removal of a photoresist pattern film, the composition of the light shielding pattern film, the film thickness and optical properties, and the like are overlapped with the description of the light shielding film 20 of the blank mask 100 and thus omitted.

Manufacturing Method of Light Shielding Film

The manufacturing method of the blank mask 100 according to one embodiment of the present specification may comprise a preparation operation of installing a transparent substrate 10 and a sputtering target in a sputtering chamber.

The manufacturing method of a blank mask 100 according to one embodiment of the present disclosure may include a film formation operation of injecting an atmosphere gas into a sputtering chamber, applying an electric power to a sputtering target, and thereby forming a pre-heating-treated substrate, in which a light shielding film 20 has been formed on the transparent substrate 10.

The manufacturing method of the blank mask 100 according to one embodiment of the present disclosure may include a thermal treatment operation of performing thermal treatment for 5 to 30 minutes at 150 to 330° C. to the pre-heating-treated substrate and thereby forming a pre-cooling-treated substrate.

The manufacturing method of the blank mask 100 according to one embodiment of the present disclosure may include a stabilizing operation of stabilizing the pre-cooling-treated substrate for 1 to 5 minutes at 30 to 50° C.

The manufacturing method of the blank mask according to one embodiment of the present disclosure may include a cooling operation of directly spraying cooling water to cool a lower surface of the transparent substrate and an upper surface of the light shielding film of the pre-cooling-treated substrate and thereby manufacturing the blank mask.

The manufacturing method of the blank mask according to one embodiment of the present specification may include a cleaning operation of cleaning the blank mask with a cleaning solution.

The film formation operation includes a first light shielding layer formation process of forming the first light shielding layer on a transparent substrate; and a second light shielding layer formation process of forming the second light shielding layer on the first light shielding layer.

In the preparation operation, a target used in the film formation of a light shielding film can be selected considering the composition of the light shielding film. A sputtering target with one target comprising a transition metal may be used. The sputtering target with two or more targets including the one target containing a transition metal may be used. The target containing the transition metal may include the transition metal in an amount of 90 at % or more. The target containing the transition metal may include the transition metal in an amount of 95 at % or more. The target containing the transition metal may include the transition metal in an amount of 99 at % or more.

The transition metal may include at least one selected from the group consisting of Cr, Ta, Ti, and Hf. The transition metal may include Cr.

The description of the transparent substrate 10 installed in a sputtering chamber is overlapped with the above description and thus omitted.

In the light shielding film 20 formation operation, the conditions for the film formation process may be applied to be different for each layers when respective layers included in the light shielding film 20 are formed. Particularly, considering the surface roughness characteristics, the extinction characteristics, and the etching characteristics of the light shielding film 20, the conditions such as the composition of an atmosphere gas, the pressure in a chamber, the electric power applied to a sputtering target, the time for film formation, the rotation speed of a substrate, and the like may be applied differently for respective layers.

The atmosphere gas may include an inert gas, a reactive gas, and a sputtering gas. The inert gas is a gas not including the element contained in the light shielding film. The reactive gas is a gas comprising the element contained in the light shielding film. The sputtering gas is a gas colliding with the target by being ionized in a plasma atmosphere. The inert gas may include helium. The reactive gas may include a gas including nitrogen. The gas including nitrogen may be for example, $N_2$, $NO$, $NO_2$, $N_2O$, $N_2O_3$, $N_2O_4$, $N_2O_5$ or the like. The reactive gas may include a gas including oxygen. The gas including oxygen may be for example $O_2$, $CO_2$, or the like. The reactive gas may include a gas including nitrogen and oxygen. The reactive gas may include a gas including both of nitrogen and oxygen. The gas including both of nitrogen and oxygen may be for example $NO$, $NO_2$, $N_2O$, $N_2O_3$, $N_2O_4$, $N_2O_5$ or the like.

The sputtering gas may be Ar gas.

A power source for supplying an electric power to a sputtering target may be DC power source, or RF power source.

In the first light shielding layer formation process, the electric power applied to a sputtering target may be 1.5 to 2.5 kW. The electric power may be 1.6 to 2 kW.

In the first light shielding layer formation process, the ratio of the flow rate of a reactive gas compared to the flow rate of an inert gas in the atmosphere gas may be 1.5 to 3. The ratio may be 1.8 to 2.7. The ratio may be 2 to 2.5.

The ratio of the amount of the oxygen compared to the amount of the nitrogen included in the reactive gas may be 1.5 to 4. The ratio of the amount of the oxygen compared to the amount of the nitrogen included in the reactive gas may be 2 to 3. The ratio of the amount of the oxygen compared to the amount of the nitrogen included in the reactive gas may be 2.2 to 2.7.

In such a case, the first light shielding layer can help the light shielding film to have sufficient extinction characteristics. Also, the etching characteristics of the first light shielding layer can be controlled to help the side surface of the patterned light shielding film to be formed close to be vertical from a surface of a transparent substrate.

The first light shielding layer formation process may be performed for 200 to 300 seconds. The first light shielding layer formation process may be performed for 210 to 240 seconds. In such a case, the first light shielding layer can help the light shielding film to have sufficient extinction characteristics.

In the second light shielding layer formation process, the electric power applied to a sputtering target may be 1 to 2 kW. The electric power may be 1.2 to 1.7 kW. In such a case, the adhesion of a photoresist pattern to a light shielding film and the convenience of removing the pattern can be improved.

In the second light shielding layer formation process, the ratio of the flow rate of a reactive gas compared to the flow rate of an inert gas in the atmosphere gas may be 0.3 to 0.8. The ratio may be 0.4 to 0.6.

In the second light shielding layer formation process, the ratio of the amount of the oxygen compared to the amount of the nitrogen included in a reactive gas may be 0.3 or less. The ratio may be 0.1 or less. The ratio may be 0.001 or more.

In such a case, the shape of a photoresist pattern placed on the surface of the second light shielding layer can be stably maintained. Also, the photoresist pattern can be easily removed from a surface of the second light shielding layer without residue. Furthermore, the etching speed of the second light shielding layer has a relatively low value compared to that of the first light shielding layer and the side surface of the patterned light shielding film can have a shape relatively close to be vertical to a transparent substrate.

The second light shielding layer formation process may be performed for 10 to 30 seconds. The formation process may be performed for 15 to 25 seconds. In such a case, the side surface of the light shielding pattern film can have a shape close to be vertical to a surface of the transparent substrate.

In the thermal treatment operation, the pre-cooling-treated substrate can be formed by thermal treatment of the pre-heating-treated substrate. In detail, after the pre-heating-treated substrate is installed in a chamber for thermal treatment, the thermal treatment can be performed.

In the thermal treatment operation, the atmosphere temperature may be 150 to 330° C. The atmosphere temperature may be 170 to 280° C. The atmosphere temperature may be 200 to 250° C. In such a case, the roughness characteristic of the surface of the light shielding film can be controlled in a predetermined range, and an excessive growth of grains in the light shielding film 20 can be substantially suppressed.

In the thermal treatment operation, the time for thermal treatment may be 5 to 30 minutes. The time for thermal treatment may be 10 to 20 minutes. In such case, thermal treatment operation can control the surface roughness characteristics to be in a proper range.

The thermal treatment operation may be performed one time. The thermal treatment operation may be performed two times or more.

When another thermal treatment is performed to the light shielding film after a thermal treatment, the temperature of the atmosphere may be 80 to 250° C. The temperature of the atmosphere may be 100 to 200° C. In such a case, the excessive growth of grains in the light shielding film due to the reoperation of thermal treatment can be effectively suppressed and simultaneously the light shielding film can have excellent adhesion and convenience of removal of the photoresist.

In the stabilizing operation, the pre-cooling-treated substrate can be stabilized. When the pre-cooling-treated substrate is cooled immediately, considerable damage may be added to the substrate due to drastic temperature variation. To prevent this, a stabilizing operation may be required.

The method for stabilizing the pre-cooling-treated substrate may be various. As one example, the pre-cooling-treated substrate may be placed out of a chamber for thermal treatment and may be left for a predetermined time in an atmosphere at room temperature. As another example, the pre-cooling-treated substrate may be placed out of a chamber for thermal treatment and may be stabilized for 1 to 5 minutes at 30 to 50° C. As another example, a gas, which is not reactive with a blank mask, may be injected in a flow rate of 5 to 10 L/min for 1 to 5 minutes to the pre-cooling-treated substrate. At this time, the gas, which is not reactive with a blank mask, may have a temperature of 20 to 40° C.

In the cooling operation, the pre-cooling-treated substrate may be cooled to be manufactured into a blank mask. In the cooling operation, the pre-cooling-treated substrate may be cooled by a water-cooling method. In detail, a cooling water may be directly sprayed to a lower surface of a transparent substrate and an upper surface of a light shielding film for cooling thereof. It was ascertained through experiments that, when the cooling operation is performed by a method of directly spraying a cooling water onto the upper surface of the light shielding film, the Rsk value of the surface of the light shielding film had a higher value and the Rku value of the surface had a lower value compared to those obtained by an air-cooling method. The drastic drop of temperature applied to the surface of the heated light shielding film and friction of cooling water physically added to the surface of the light shielding film may contribute to cause these differences. These can give substantial influence on the roughness characteristics of the surface of the light shielding film, in particular, the skewness and kurtosis of the surface.

The temperature of the cooling water applied to the cooling operation may be 10 to 30° C. In such a case, the roughness characteristics such as skewness and kurtosis of the surface of the light shielding film can be effectively controlled.

The cooling water may be a fluid, which does cause a chemical denaturalization of the light shielding film. The cooling water may be $H_2O$.

One or more nozzles for spraying cooling water may be installed over the light shielding film. One or more nozzles for spraying cooling water may be installed over the light shielding film and under the substrate, respectively.

When two or more nozzles are installed over one surface of a blank mask, the angle between the nozzles when observed from the one surface may be 60 degrees or more. As one example, the angle between the nozzles may be 90 degrees or more.

The nozzle may be installed in a position spaced apart by 5 to 20 mm from the surface of the light shielding film. The nozzle may be installed in a position spaced apart by 5 to 20 mm from the surface of the light shielding film and the surface of the substrate, respectively.

The nozzle may be installed to form an angle of 30 to 75 degrees with the surface of the light shielding film. The nozzle may be installed to form an angle of 45 to 60 degrees with the surface of the light shielding film. The nozzle may be installed to form an angle of 30 to 75 degrees with the surface of the substrate. The nozzle may be installed to form an angle of 45 to 60 degrees with the surface of the substrate. The nozzle may be installed toward a position spaced apart from the center of the blank mask, i.e., a cooling target. As one example, the nozzle may be installed toward the position spaced apart by about 10 mm from the center of the blank mask. In such a case, damage of the light shielding film due to spraying can be minimized, and simultaneously the surface roughness characteristics of the light shielding film can be effectively controlled.

After completion of nozzle arrangement over the light shielding film and under the transparent substrate, cooling water can be directly sprayed through the nozzles and thereby can control the surface roughness characteristics of the light shielding film.

Total flow rate of cooling water sprayed onto the surface of the light shielding film may be 0.5 to 1.5 L/min. Total flow rate of the cooling water may be 0.8 to 1.2 L/min. In such a case, skewness, and kurtosis of the surface of the light shielding film can be substantially controlled and damage may not be incurred to the blank mask.

Total flow rate of cooling water sprayed onto the surface of the transparent substrate may be 0.5 to 1.5 L/min. Total flow rate of the cooling water may be 0.8 to 1.2 L/min. In such a case, the temperature distribution to the thickness direction of the blank mask can be controlled to be comparatively even.

The cooling time may be 2 to 15 minutes. The cooling time may be 3 to 10 minutes. In such a case, the photoresist pattern formed on the surface of the light shielding film can be stably maintained, and the light shielding film can help to remove the photoresist pattern without residue.

After the cooling operation through cooling water, the cooling water present on the surface of the blank mask can be removed by rotating the blank mask. In detail, after rotating for 30 to 60 seconds at 1000 to 2000 rpm, decelerating stably for 10 to 60 seconds may be performed to suspend rotation of the blank mask.

In the cleaning operation, the blank mask can be cleaned with a cleaning solution. Through the cleaning operation, residue on the surface of the light shielding film can be removed. The cleaning operation includes a spray process of cleaning solution, which is spraying cleaning solution to a blank mask, and a rinsing process, which is removing the cleaning solution present on the surface of the blank mask through the rinse solution.

In the spray process of cleaning solution, the cleaning solution may be for example, SC-1 (standard clean-1) solution. The SC-1 solution is a mixed solution of ammonia water, hydrogen peroxide, and water. The SC-1 solution may include ammonia water in an amount of 10 to 20 parts by weight, hydrogen peroxide in an amount of 10 to 20 parts by weight, and water in an amount of 60 to 80 parts by weight based on a total weight of the SC-1 solution. The spray process of cleaning solution may be performed for 60 to 600 seconds.

In the rinsing process, the cleaning solution present on the surface of the blank mask can be removed through a rinse solution. The rinse solution may be for example, ozone water.

The blank mask manufactured by the above manufacturing method includes a transparent substrate and a light shielding film disposed on the transparent substrate.

The light shielding film includes a transition metal, and at least one selected from the group consisting of oxygen and nitrogen.

A Mtr value of Equation 1 on the surface of the light shielding film is 6 or less.

The light shielding film is one cooled by directly spraying cooling water to the surface of the light shielding film.

Hereinafter, the further detailed description of the example embodiments will be made.

Manufacture Example: Forming a Light Shielding Film

Comparative Example 1: A transparent substrate with a width of 6 inches, a length of 6 inches, and a thickness of 0.25 inches made from a quartz material was installed in a sputtering chamber using DC power. A chrome target was installed in the chamber to have T/S distance of 255 mm with an angle of 25 degrees between the substrate and the target.

Thereafter, an atmosphere gas, which was mixed by Ar of 19 volume ratio %, $N_2$ of 11 volume ratio %, $CO_2$ of 36 volume ratio %, and He of 34 volume ratio %, was introduced into the chamber, the electric power supplied to the sputtering target was 1.85 kW, and the sputtering process was performed for 230 to 330 seconds, to form the first light shielding layer.

After the first light shielding layer is formed, an atmospheric gas mixed by Ar of 57 volume ratio % and $N_2$ of 43 volume ratio % was introduced into the chamber, and the electric power supplied to the sputtering target was 1.5 kW to form the second light shielding layer, and thereby a sample with a light shielding film was manufactured.

Example 1: After manufacturing a pre-heating-treated substrate in the same condition as Comparative Example 1, the pre-heating-treated substrate was installed in a chamber for thermal treatment. Thereafter, the atmospheric temperature was applied to be 250° C. and thermal treatment was performed for 15 minutes, to manufacture a pre-cooling-treated substrate. The pre-cooling-treated substrate was placed out of the chamber for thermal treatment and rotated for 2 minutes at 30 rpm under the atmosphere of 40° C. to be stabilized. The pre-cooling-treated substrate after the stabilizing was treated for cooling by a water-cooling method. In detail, one nozzle was installed over the light shielding film of the pre-cooling-treated substrate after the stabilizing operation, and two nozzles were installed under the substrate. One nozzle, which is over the light shielding film, was installed to form an angle of 60 degrees between the nozzle and the surface of the light shielding film. A direction of the nozzle had to face a position spaced apart by about 10 mm from a center of an upper surface of the pre-cooling-treated substrate. Also, two nozzles were installed to form an angle of 60 degrees between the nozzle and the lower surface of the transparent substrate, respectively. Each nozzle was disposed to form an angle of 90 degrees between one nozzle and the other nozzle, when observed from the lower surface of the transparent substrate, and to face a position spaced apart by about 10 mm from the center of the lower surface of the pre-cooling-treated substrate.

Subsequently, cooling water was directly sprayed onto the pre-cooling-treated substrate for 5 minutes through the nozzles and thereby a blank mask sample was manufactured. The sprayed amount of cooling water from the nozzle installed over the light shielding film was set to be 1.1 L/min, and the sprayed amount of cooling water from each nozzle installed over the substrate was set to be 0.55 L/min. The cooling water was $H_2O$ at 25° C.

The blank mask sample after cooling treatment was rotated for 40 seconds at 1500 rpm and deaccelerated steadily for 15 seconds to be suspended.

Example 2: After manufacturing a pre-heating-treated substrate under the same condition as Comparative Example 1, the pre-heating-treated substrate was disposed in a chamber for thermal treatment. Thereafter, the atmospheric temperature was applied to be 200° C. and thermal treatment was performed for 15 minutes, thereby manufacturing a pre-cooling-treated substrate. The pre-cooling-treated substrate was stabilized under the same condition as Example 1. After stabilizing, the pre-cooling-treated substrate was treated for cooling by water-cooling method. The condition of cooling treatment is the same as Example 1, except for applying $H_2O$ at 20° C. as cooling water.

Example 3: After a pre-heating-treated substrate was manufactured under the same condition as Comparative Example 1, the pre-heating-treated substrate was disposed in a chamber for thermal treatment. Subsequently, a primary thermal treatment was performed at atmospheric temperature of 250° C. for 15 minutes. After the primary thermal treatment, the secondary thermal treatment was performed at atmospheric temperature of 150° C. for 15 minutes, thereby manufacturing a pre-cooling-treated substrate. The pre-cooling-treated substrate after the secondary thermal treatment was stabilized under the same condition as Example 1. After stabilizing, the pre-cooling-treated substrate was treated for cooling by a water-cooling method. The condition of cooling treatment is the same as Example 1.

Example 4: After a pre-heating-treated substrate was manufactured under the same condition as Comparative Example 1, the pre-heating-treated substrate was disposed in a chamber for thermal treatment. Subsequently, the atmospheric temperature was applied to be 250° C., thermal treatment was performed for 15 minutes, and thereby a pre-cooling-treated substrate was manufactured. The pre-cooling-treated substrate after thermal treatment was stabilized under the same condition as Example 1. The pre-cooling-treated substrate after the stabilizing operation was treated for cooling by water cooling method and thereby a blank mask sample was manufactured. The condition of cooling treatment is the same as Example 1 except for applying $H_2O$ at 20° C. as cooling water.

Comparative Example 2: After a pre-heating-treated substrate was manufactured under the same condition, the pre-heating-treated substrate was disposed in a chamber for thermal treatment. Subsequently, thermal treatment was performed at atmospheric temperature of 250° C. for 10 minutes, and a pre-cooling-treated substrate was manufactured. The pre-cooling-treated substrate was placed out of the chamber for thermal treatment and rotated for 2 minutes at 30 rpm in the atmosphere of 40° C., to be stabilized. After stabilizing, the pre-cooling-treated substrate was treated for cooling by air cooling method for 5 minutes in the atmospheric temperature of 25° C. and a blank mask sample was manufactured. The gas applied to cooling treatment is air.

Comparative Example 3: After a pre-heating-treated substrate was manufactured under the same condition as Comparative Example 1, the pre-heating-treated substrate was disposed in a chamber for thermal treatment. Subsequently, a primary thermal treatment was performed at atmospheric temperature of 250° C. for 15 minutes. After the primary thermal treatment, a secondary thermal treatment was performed at atmospheric temperature of 350° C. for 15 minutes, and thereby a pre-cooling-treated substrate was manufactured. The pre-cooling-treated substrate after the secondary thermal treatment was stabilized under the same condition as Example 1. After stabilizing, a blank mask sample was manufactured by cooling treatment under the same condition as Comparative Example 2.

The conditions for thermal treatment and cooling of each Example or each Comparative Example are described in Table 1 below.

Evaluation Example: Measurement of Surface Roughness

The Rsk and Rku values of the surface of the light shielding films of Examples 1 to 4 and Comparative Examples 1 to 3 were measured in accordance with ISO_4287, and the Mtr values were calculated from the Rsk values and Rku values.

In detail, the Rsk values and Rku values were measured in non-contact mode with a scan speed of 0.5 Hz using XE-150 model available from PARK SYSTEM including PPP-NCHR, which is cantilever model available from PARK SYSTEM, as a probe, from the area of 1 μm width and length of the center of the light shielding film.

Thereafter, the Mtr value was calculated from the measured Rsk value and Rku value of each of Examples and Comparative Examples.

The measured result of each of Examples and each Comparative Examples is described in Table 2 below.

Evaluation Example: Measurement of the Amount of Photoresist Residue

Do value, which is the weight of a blank mask before the formation of a photoresist film on the light shielding film of each Example or each Comparative Example, was measured.

Thereafter, a photoresist composition was coated on the light shielding film of each Example or each Comparative Example by applying a spin coating method. Subsequently, the applied photoresist composition was dried for 620 seconds at 140° C. to form a photoresist film with a thickness of 1300 Å.

The photoresist composition was applied by XFP255 model available from FUJI.

The Ds value, which is the weight of a blank mask after removal of the photoresist film, was measured. The photoresist film was removed by dipping in a peroxymonosulfuric acid solution, which is a mixed solution of sulfuric acid and oxygenated water.

The Dw value was calculated from Ds and Do values of each Example or each Comparative Example.

The measured result of each Example or each Comparative Example was described in Table 2 below.

TABLE 1

| | Primary Thermal Treatment | | Secondary Thermal Treatment | | Cooling Treatment | | |
| --- | --- | --- | --- | --- | --- | --- | --- |
| | Temperature (° C.) | Time (Minute) | Temperature (° C.) | Time (Minute) | Type | Temperature (° C.) | Time (Minute) |
| Example 1 | 250 | 15 | — | — | Water Cooling | 25 | 5 |

TABLE 1-continued

| | Primary Thermal Treatment | | Secondary Thermal Treatment | | Cooling Treatment | | |
|---|---|---|---|---|---|---|---|
| | Temperature (° C.) | Time (Minute) | Temperature (° C.) | Time (Minute) | Type | Temperature (° C.) | Time (Minute) |
| Example 2 | 200 | 15 | — | — | Water Cooling | 20 | 5 |
| Example 3 | 250 | 15 | 150 | 15 | Water Cooling | 25 | 5 |
| Example 4 | 250 | 15 | — | — | Water Cooling | 20 | 3 |
| Comparative Example 1 | — | — | — | — | — | — | — |
| Comparative Example 2 | 250 | 10 | — | — | Air Cooling | 25 | 5 |
| Comparative Example 3 | 250 | 15 | 350 | 15 | Air Cooling | 25 | 5 |

TABLE 2

| | Rsk | Rku | Mtr | Dw |
|---|---|---|---|---|
| Example 1 | −0.52 | 3.833 | 1.993 | 0.005 |
| Example 2 | −0.756 | 5.657 | 4.277 | 0.008 |
| Example 3 | −0.648 | 3.981 | 2.58 | 0.006 |
| Example 4 | −0.399 | 2.494 | 0.995 | 0.004 |
| Comparative Example 1 | −1.212 | 9.204 | 11.155 | 0.085 |
| Comparative Example 2 | −1.017 | 7.537 | 7.665 | 0.017 |
| Comparative Example 3 | −2.569 | 14.006 | 35.981 | 0.221 |

In the Table 2, the Mtr values of Examples 1 to 4 showed 6 or less, however, Comparative Examples 1 to 3 showed an Mtr value of 7 or more.

For Dw value, Examples 1 to 4 showed a value of 0.01% or less, however, Comparative Examples 1 to 3 showed a value of more than 0.01%.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A blank mask comprising:
a transparent substrate comprising an upper side and a back side where an exposure light is incident; and
a light shielding film disposed on the upper side of the transparent substrate,
wherein the light shielding film is for patterning,
wherein the light shielding film blocks at least some portion of the exposure light,
wherein the light shielding film comprises a transition metal and at least one selected from the group consisting of oxygen and nitrogen,
wherein the light shielding film comprises a first light shielding layer and a second light shielding layer disposed on the first light shielding layer,
wherein the second light shielding layer comprises a transition metal in an amount of 55 to 75 at %,
wherein the first light shielding layer comprises a transition metal in an amount of 35 to 55 at %,
wherein a Mtr value of Equation 1 below of a surface of the light shielding film is 0.5 to 4,
wherein the light shielding film has an optical density of 1.8 or more for a light with a wavelength of 193 nm:

$$Mtr = |Rsk| * Rku \quad \text{[Equation 1]}$$

where, in the Equation 1, |Rsk| is an absolute value of an Rsk value, which is a height skewness of the surface of the light shielding film, and Rku is kurtosis of the surface of the light shielding film,
wherein the Rsk value is −1 or more,
wherein the light shielding film comprises a first light shielding layer and a second light shielding layer disposed on the first light shielding layer,
wherein a film thickness of the first light shielding layer is 250 to 650 Å and a film thickness of the second light shielding layer is 30 to 200 Å, and
wherein a sum of an amount of the nitrogen and the oxygen in the second light shielding layer is 10 to 35 at %.

2. The blank mask of claim 1, wherein the Rsk value is 1 or less.

3. The blank mask of claim 1, wherein the Rku value is 6 or less.

4. The blank mask of claim 1, wherein a Dw value of Equation 2 below of the light shielding film is 0.01% or less:

$$Dw = \frac{Ds - Do}{Do} \times 100(\%) \quad \text{[Equation 2]}$$

where, in the Equation 2, Ds is a weight of the blank mask measured after forming a photoresist film of 1300 Å thickness on the light shielding film and removing the photoresist film, and Do is a weight of the blank mask measured before forming the photoresist film on the light shielding film.

5. The blank mask of claim 1, wherein the transition metal comprises at least any one selected from the group consisting of Cr, Ta, Ti and Hf.

6. The blank mask of claim 1, wherein the light shielding film is treated by cooling with cooling water directly sprayed onto the surface of the light shielding film.

7. A photomask comprising:
a transparent substrate comprising an upper side and a back side where an exposure light is incident; and
a light shielding pattern film disposed on the upper side of the transparent substrate,
wherein the light shielding film blocks at least some portion of the exposure light,
wherein the light shielding pattern film comprises a transition metal and at least one selected from the group consisting of oxygen and nitrogen,
wherein the light shielding film comprises a first light shielding layer and a second light shielding layer disposed on the first light shielding layer,
wherein the second light shielding layer comprises a transition metal in an amount of 55 to 75 at %,
wherein the first light shielding layer comprises a transition metal in an amount of 35 to 55 at %,
wherein a Mtr value of Equation 1 below of a surface of the light shielding pattern film is 0.5 to 4,
wherein the light shielding film has an optical density of 1.8 or more for a light with a wavelength of 193 nm:

$$Mtr=|Rsk|*Rku \quad \text{[Equation 1]}$$

where, in the Equation 1, |Rsk| is an absolute value of an Rsk value, which is a height skewness of the surface of the light shielding pattern film, and Rku is kurtosis of the surface of the light shielding pattern film,
wherein the Rsk value is −1 or more,
wherein the light shielding pattern film comprises a first light shielding layer and a second light shielding layer disposed on the first light shielding layer, and
wherein a film thickness of the first light shielding layer is 250 to 650 Å and a film thickness of the second light shielding layer is 30 to 200 Å, and
wherein a sum of an amount of the nitrogen and the oxygen in the second light shielding layer is 10 to 35 at %.

8. The photomask of claim 7, wherein the Rsk value is 1 or less.

9. The photomask of claim 7, wherein the Rku value is 6 or less.

10. The photomask of claim 7, wherein the transition metal comprises at least one selected from the group consisting of Cr, Ta, Ti and Hf.

11. A method of manufacturing a blank mask comprising:
disposing a transparent substrate and a sputtering target in a sputtering chamber;
injecting an atmosphere gas into the sputtering chamber, supplying an electric power to the sputtering target, sputtering a light shielding, and thereby forming a light shielding film coated substrate, in which the light shielding film is formed on the transparent substrate;
performing thermal treatment for 5 to 30 minutes at 150 to 330° C. to the light shielding film coated substrate and thereby forming a heated substrate; and
spraying a cooling water directly onto a surface of the transparent substrate and a surface of the light shielding film of the heated substrate and thereby manufacturing the blank mask.

12. The method of claim 11, further comprising stabilizing the heated substrate for 1 to 5 minutes at 30 to 50° C.

13. The method of claim 11, wherein a temperature of the cooling water is 10 to 30° C.

14. The method of claim 11, wherein the cooling water is sprayed in a flow rate of 0.5 to 1.5 L/min.

15. The method of claim 11, wherein the cooling water is sprayed at an angle of 30 to 75° with the surface of the light shielding film.

16. The method of claim 11, wherein a nozzle to spray the cooling water is disposed over the surface of the light shielding film and spaced apart by 5 to 20 mm from the surface of the light shielding film.

17. The method of claim 11, wherein two or more nozzles to spray the cooling water are disposed over one surface of the blank mask and an angle between the two or more nozzles when observed from the one surface is 60 degrees or more.

18. The method of claim 11, wherein the thermal treatment comprises a primary thermal treatment and a secondary thermal treatment.

* * * * *